United States Patent [19]

Axford

[11] 4,335,390
[45] Jun. 15, 1982

[54] CATHODE RAY TUBE PRINTING APPARATUS AND METHOD

[75] Inventor: John G. Axford, Winchester, England

[73] Assignee: International Business Machines Corporation, Armonk, N.Y.

[21] Appl. No.: 101,343

[22] Filed: Dec. 7, 1979

[30] Foreign Application Priority Data

Dec. 27, 1978 [GB] United Kingdom ............... 49993/78

[51] Int. Cl.³ ............................................ G01D 15/06
[52] U.S. Cl. ................................ 346/158; 346/110 R; 346/161; 358/302; 358/296
[58] Field of Search ................... 346/110 R, 161, 158; 358/901, 250, 302, 296, 132, 127

[56] References Cited

U.S. PATENT DOCUMENTS

| | | | |
|---|---|---|---|
| 3,605,109 | 9/1971 | Tyler | 346/1 |
| 3,663,748 | 5/1972 | Boon | 346/161 |
| 3,725,575 | 4/1973 | Dell | 346/110 R |
| 3,789,259 | 1/1974 | Allen | 346/110 R |
| 3,938,164 | 2/1976 | Ohmishi | 346/161 |
| 3,968,499 | 7/1976 | Lowe et al. | 346/110 R |
| 4,038,668 | 7/1977 | Quarton | 346/110 R |
| 4,039,746 | 8/1977 | Talbot | 358/132 |
| 4,074,281 | 2/1978 | Quarton | 235/151 |
| 4,201,996 | 5/1980 | Stein | 346/161 |

FOREIGN PATENT DOCUMENTS 1068402  5/1967  United Kingdom .
1300124  12/1972  United Kingdom .

Primary Examiner—Vincent P. Canney
Assistant Examiner—Alan Faber
Attorney, Agent, or Firm—Otto Schmid, Jr.

[57] ABSTRACT

Apparatus is described for producing hard copy prints of images displayed on a raster-scanned CRT terminal. A row of light fibers 4 are attached to a preselected scan line of the CRT 3 located behind the CRT bezel 5. The other ends of the row of light fibers 4 are located along the surface of a print roller 8 on which light sensitive paper 6 is supported. A light pattern produced as a result of an image scan along the preselected scan line is transmitted by the light fibers 4 to the paper 2 which is exposed to form a latent image of the light pattern in a print row on the paper.

In order to print a complete image, the paper is drawn past the print row and exposed successively to each raster scan row of the image to be printed. The exposed paper is then passed through a developing station 10 where the latent image is developed by heat. Two modes of operation are described. In one mode the image display is interrupted during the print cycle, and in the other mode both display and printing are performed concurrently.

13 Claims, 8 Drawing Figures

CATHODE RAY TUBE PRINTING APPARATUS AND METHOD

BACKGROUND OF THE INVENTION

The invention relates to apparatus and method for producing hard copy of an optical image displayed on a faceplate of a raster scanned cathode ray tube (CRT) display device.

It is recognized that in office system terminals of the future, the need for local printing will be a requirement even though most operations will be executed by interacting directly with information displayed on a display device. Current stand-alone printers which operate to produce hard copy output directly from digital information supplied, for example from a control unit, are fast and produce high quality print on ordinary paper but are expensive. Low utilization of such devices as output printers for display terminals tends to make them uneconomic.

Hard copy of images displayed on interactive display terminals of the type which rely on the storage tube principle for their operation can be obtained using specially designed stand-alone printing apparatus. Such printing apparatus requires a tailor-made CRT with a flat cross-section tube which scans only in one dimension. In order to print an image displayed on the storage tube faceplate, the image is interrogated with a read beam which is raster-scanned across the faceplate. A stream of analogue pulses representing the lit portions of successive scanned rows of the stored image are produced from the storage tube faceplate. These pulses are supplied to the intensity control of the printer CRT which is controlled to scan in synchronism with the line-by-line scan of the read beam raster. Thus, the entire image is reproduced one raster scan line at a time on the elongated faceplate of the printer CRT. A paper feed mechanism in the printing apparatus draws light sensitive paper over the CRT faceplate at a rate corresponding to the rate of progression of the raster scan across the stored image. By this means, the paper is exposed line-by-line by the lit portions of the printer CRT and a latent image corresponding to the displayed image is generated in the paper. The exposed paper is then fed through a developing station in order to develop the latent image.

The high cost of storage tube CRT's makes them unacceptable for such high quantity use as is required in an office system environment and accordingly the terminal displays are usually provided by conventional raster-scanned CRT's. A need exists, therefore, for printing apparatus by which a terminal operator can obtain a hard copy of an image displayed on a raster-scanned CRT terminal promptly and cheaply.

SUMMARY OF THE INVENTION

According to the invention, apparatus for generating a hard copy of an optical image displayed on a faceplate of a raster-scanned CRT display device comprises in combination, a raster-scanned CRT display device, a plurality of light fibers supported in a row along a preselected scan line position on the faceplate arranged to collect light emitted from contiguous regions along said scan line position and to transmit any such light to corresponding positions along a print row remote from said CRT faceplate, means for supporting a print receiving medium at said print row, the arrangement being such that, in use, an image of the light transmitted by said fibers is produced in said medium, means for moving such a medium supported at said print row in a direction transverse to said print row, display logic operable in response to the rate of movement of such a medium to control the successive supply of raster-scanned lines of an image to said preselected scan line so that images resulting therefrom representing successive raster scan lines of the image are produced in corresponding print line positions in said medium, and means operable to develop images so produced.

Further, according to the invention, a method of producing hard copy of an optical image displayed on a faceplate of a raster-scanned CRT comprises the steps of selecting a horizontal line scan position on the faceplate, controlling the CRT display logic to supply in succession raster-scan lines of the image at said selected line scan position, guiding by means of optical fibers, the successive optical patterns formed at said selected line scan position to a corresponding output print line remote from the tube faceplate, moving a print receiving medium past said output print line in a direction transverse thereto, generating images in said moving medium of said successive optical patterns in corresponding line positions on said medium, and thereafter developing images so produced.

BRIEF DESCRIPTION OF THE DRAWINGS

In order that the invention may be fully understood, preferred embodiments thereof will now be described with reference to and as illustrated in the accompanying drawings. In the drawings.

DESCRIPTION OF THE PREFERRED EMBODIMENTS

Figure 1:
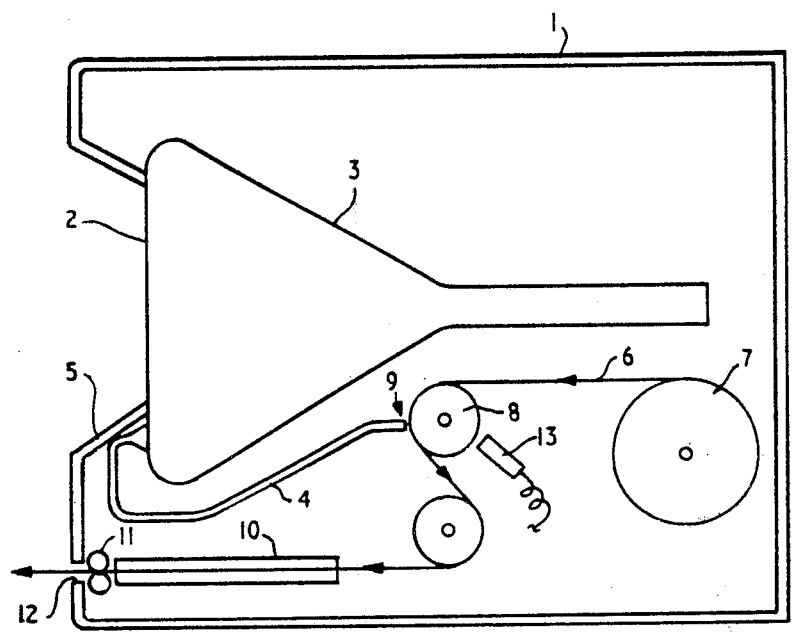
FIG. 1 shows schematically CRT printing apparatus according to the present invention.

The principle of operation of the CRT printing apparatus, subject of the present invention, will now be described with reference to FIG. 1. This figure shows schematically a portion of a raster-scanned CRT display terminal and, included in the CRT enclosure 1, additional printer mechanism for selectively producing hard copy printed output of displayed information viewed by an operator on faceplate 2 of CRT 3. The printer mechanism consists of a contiguous row of light fibers 4 (only one visible in FIG. 1) arranged side-by-side, and attached to the faceplate 2 of the tube along a preselected scan line, conveniently concealed behind the bezel 5. With this arrangement, light generated from lit portions (pels) of the preselected scan line is transmitted through the fibers to corresponding positions at the free ends of the row. Light sensitive paper 6 from supply roll 7 is supported by print roller 8 at the ends of the row of light fibers 4 at a print station 9.

Accordingly, a latent image of the lit pels along the preselected scan row of the tube is produced along a corresponding print row on the light sensitive paper. By moving the light sensitive paper 6 past the ends of the light fibers at the print station 9 in a controlled manner and, at the same time, changing the information displayed along the preselected scan line, a two-dimensional latent image can be produced. A latent image exposed in this manner is developed by passing the paper 6 over a further guide roller and through a developing station 10. The development process depends on the type of light sensitive paper used. For example, if the paper is of the dry silver type, then development of the latent image is by heat. The paper carrying the developed image is drawn from the developing station 10 by pinch-rollers 11 and emerges from print slot 12 for the operator to collect.

In order to control the printing operation, a means of accurately monitoring the rate of paper feed through the print station 9 is required. This is achieved by means of a plurality of positioned marks provided on the print roller 8 which are sensed by a position transducer 13 as the roller rotates. Alternatively, the position marks may be carried by a separate shaft encoder disk mounted for rotation on the print roller drive spindle. Such encoders are well known involving, for example, optical, magnetic or inductive sensing techniques and further description of their specific structure is unnecessary for the understanding of the present invention. Since the printing mechanism is to be used to produce hard copy of an actual image on display, the position marks are provided at a precision equal to the number of raster-scan lines on the screen. Finally, it will be observed from FIG. 1 that the input ends of light fibers 4 attached to the faceplate 2 are widened or flared. The purpose of this is to compensate for tolerances and distortion of the vertical position of the CRT beam along the preselected scan line during printing operations.

The operation of the print mechanism described above will now be explained. Suppose that an image to be printed is being displayed on the screen. On print command initiation by the operator or by program control, the normal vertical scan of the CRT is suspended and replaced by a fixed vertical deflection to bring the horizontal scan to the preselected row under the flared ends of the light fibers 4. The display logic operates so that the first raster line of the image only is displayed. The light sensitive paper is therefore exposed along a first print row to this first line of the image. Pinch-rollers 11 are set in motion and the light sensitive paper 6 is drawn from supply roll 7 through the print station 9 and developing station 10. Each time a shaft encoder pulse is sensed by transducer 13 the scan line address is advanced by one so that each raster scan line of the image is supplied in succession to the print station until the whole image has been exposed. The rate of paper feed is selected to suit the sensitivity of the paper and the available light from the CRT.

The CRT printing apparatus thus far described can be operated in either of two modes. In Mode 1, the image display is shut off during printing and the display logic controlled to supply the successive scan lines of the image at the required rate. In Mode 2, the printing and display operations are time shared resulting in a somewhat slower printing rate. In this mode, the requirement for a fixed vertical deflection is obviated, as will be explained later. Both of these modes of operation will be described in the detailed embodiments of the invention to follow which include both so-called bit buffer and character generation implementations.

MODE 1—Display and Print Separately

1. Bit Buffer Implementation

Figure 2:
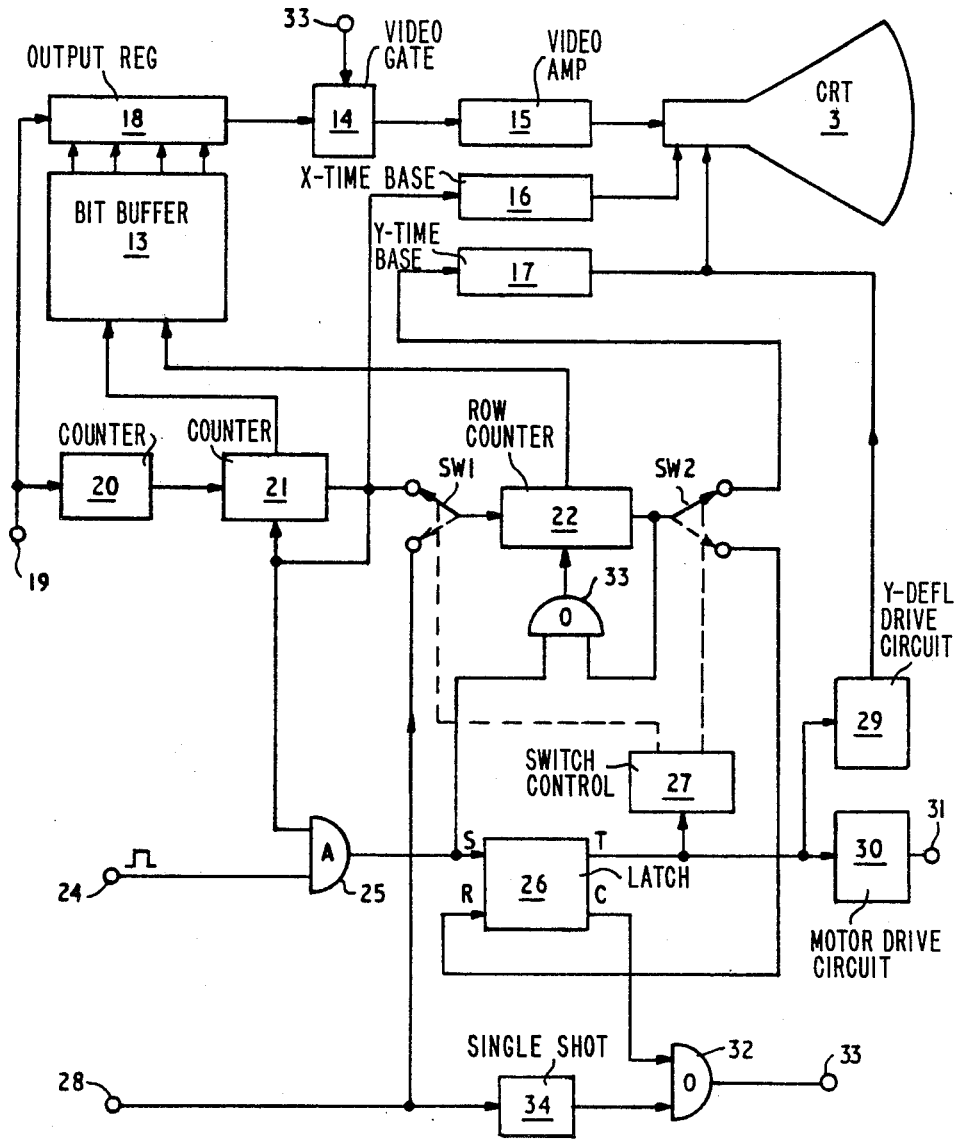
FIG. 2 shows a first implementation of the invention in which the CRT image is retained in a bit buffer and image display is interrupted during printout.

FIG. 2 shows the circuit details of CRT control circuits for a noninterlaced raster-scanned CRT terminal employing a refresh bit buffer. During normal operation of this display, the bit buffer 13 holds the complete image to be displayed on the CRT 3 as a matrix of bits. The significance of each of the bits specifies whether the corresponding pel on the screen is on (lit) or off (unlit). During image display, the contents of the bit buffer are sequentially interrogated to read out the stored data raster-scan-line by raster-scan-line at the bit rate required by the CRT 3. This continuous sequence of image bits is supplied via a video gate circuit 14 to the video amplifier 15 of the CRT 3. The CRT X-time base 16 and Y-time base 17 are controlled in synchronism with the bit buffer interrogation so that the stored image is continuously displayed on the screen.

Figure 3:
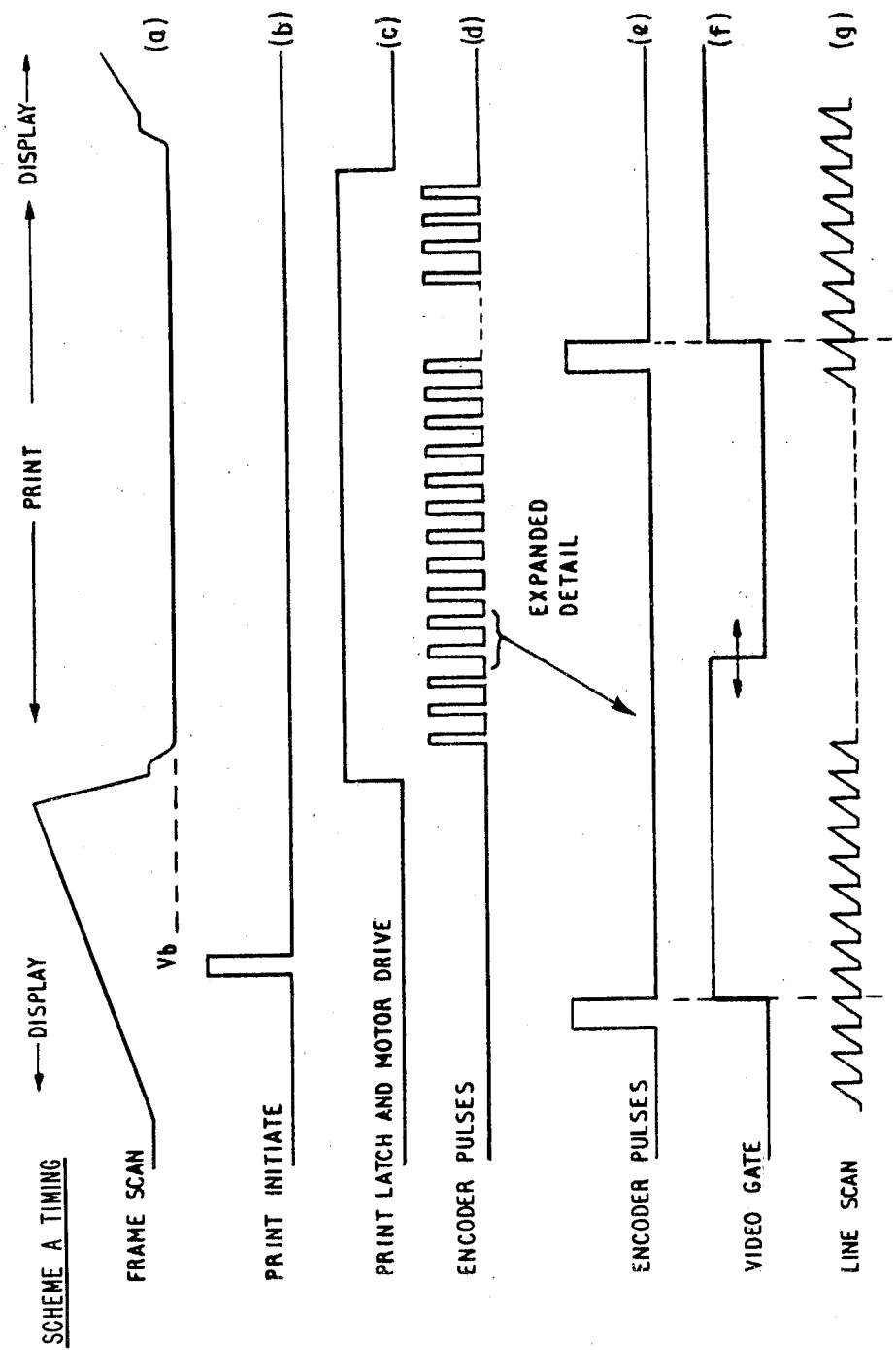
FIG. 3 shows various waveforms generated during operation of the apparatus shown in FIG. 2.

In practice, the stored image data is read out from the bit buffer 13 in parallel 'm' bits at a time into an output register 18 having 'm' stages. This register is continuously clocked by a pel clock signal applied to input clock terminal 19. The pel clock signal is also supplied via a divide-by 'm' counter 20 to a row address counter 21. The counter 21 has 'p' stages where (m×p) is equal to the total number of pels in an image row. The contents of the counter are used to determine the column address of the bit buffer. The address is incremented each time counter 21 is clocked on one stage by the divided pel clock signal from counter 20. There are 'p' different column addresses for each scan row. An overflow from counter 21 occurs at the end of a scan row and the overflow pulse is used to reset the column counter 21 to zero, to increment a row counter 22 via switch SW1 in its display position as shown, and to initiate the restart of the X time base 16 in preparation for the display of the next raster scan line of the image. The row counter 22 has 'q' stages equal in number of the total number of raster scan lines of the display. The row address of the bit buffer 13 is incremented by one each time the row counter is clocked, that is, at the end of the display of each complete scan row. An overflow from the row counter 22 occurs at the end of a frame scan and the overflow pulse is used to reset the row counter itself via one input of OR-gate 23, and to initiate the restart of the Y time base 17 via a second switch SW2 in its display position as shown in preparation of the next frame scan. This somewhat over-simplified procedure is repeated at the frame scan rate whereby the stored image is continuously displayed on the CRT 3. The apparatus so far described in respect of the bit buffer implementation is standard and more details of its structure and operation is not required for the understanding of the present invention. The operation of the additional print control circuits will now be described with reference to the waveforms in FIG. 3.

Upon initiation of a print operation by an operator or program, a print signal, waveform (b), is supplied to print terminal 24. This signal, is supplied as one input to AND-gate 25 which has its second input supplied from the overflow of counter 21. Thus, a print operation is only started at the end of the current scan row when an overflow appears at the output of column counter 21. At this time, the column counter 21 is reset to zero and specifies the first of 'p' column addresses at the start of a new line scan operation. The print pulse from AND-gate 25 is applied to the S input of a print latch 26 which becomes set, providing an output positive set signal, waveform (c), on terminal T and its inverse on terminal C. The print pulse from AND-gate 25 is also supplied as second input to OR-gate 23 through which it is transmitted to reset row counter 22 to zero. At this time, the reset row and column counters address the start of the stored image scan ready for the initiation of the print cycle.

The print latch signal on terminal T and its inverse on terminal C are supplied to switch control 27 which switches both switches SW1 and SW2 to their print positions (shown dotted in FIG. 2). In this position, switch SW1 connects row counter 22 to input terminal 28 supplied with shaft encode pulses waveform (d), and in expanded detail waveform (e), from the shaft encoder previously described with reference to FIG. 1. These pulses are supplied during the subsequent print operation, one for each print line and are used instead of the column counter 21 to increment the row counter 22. Simultanteously, the print latch signal is applied to a Y-deflection bias circuit 29 which supplies a predetermined Y-bias voltage Vb to the frame scan circuits, waveform (a). The bias is selected as described previously so that the horizontal scan during the print cycle is located at the bottom of the screen hidden behind the bezel. The signal from latch 26 is also applied to a motor drive circuit 30 which produces an appropriate drive current on terminal 31 for the motor (not shown) driving the paper feed pinch-rollers 11 (FIG. 1).

During normal display, the video gate 14 is held open by means of a positive level signal at the C output of print latch 26. This signal is applied to one input of OR-gate 32 through which it is transmitted to gate enable terminal 33 of the video gate 14. As soon as the print latch 26 is set, the signal on the C terminal goes negative and the video gate 14 closes, preventing the image bits, continuously supplied from bit buffer 13, from being transmitted to the video amplifier 15. The first shaft encode pulse supplied from the position encoder to terminal 28 sets a single shot 34 the output from which is connected as second input to OR-gate 32. Thus, the video gate is opened, waveform (f), on occurrence of the first shaft encode pulse and remains open for the duration of the time-out period of the single shot 34. By this means, the first image scan row of data is repetitively displayed at the preselected print display line on the tube to enable the corresponding print latent image to be formed on the paper. The number of image line scans required depends, as mentioned previously, upon the sensitivity of the paper to the light produced by the tube. Since the horizontal scan, waveform (g), is continuous, the time-out period of the single-shot 34 is adjusted accordingly. The duration of the single-shot time out may be adjusted within preset limits by an operator to provide some measure of control over the degree of image exposure. The video gate signal, waveform (f), terminates when the single shot 34 times-out.

The occurrence of the next shaft encode pulse, waveform (e), at terminal 28 causes row counter 22 to increment the row address of bit buffer 13 and to reopen the video gate, waveform (f). A latent image of the second scan line from the buffer is produced along the second print row on the paper. The process is repeated for each image scan row until a latent image of the entire information stored in the buffer has been produced in the paper. At this time, row counter 22 overflows and a pulse is transmitted via SW2 in its print position to the reset terminal R of print latch 26, which is reset. The print output signal on the T output drops to its 'down' level causing switch control circuit 27 to return switches SW1 and SW2 to the display positions. Simultaneously, the signal level on the C output rises to its 'up' level and the video gate 14 is opened to permit normal display of the information under control of the X and Y time base circuits.

MODE 1—Display and Print Separately

2. Character Generator Implementation

Figure 4:
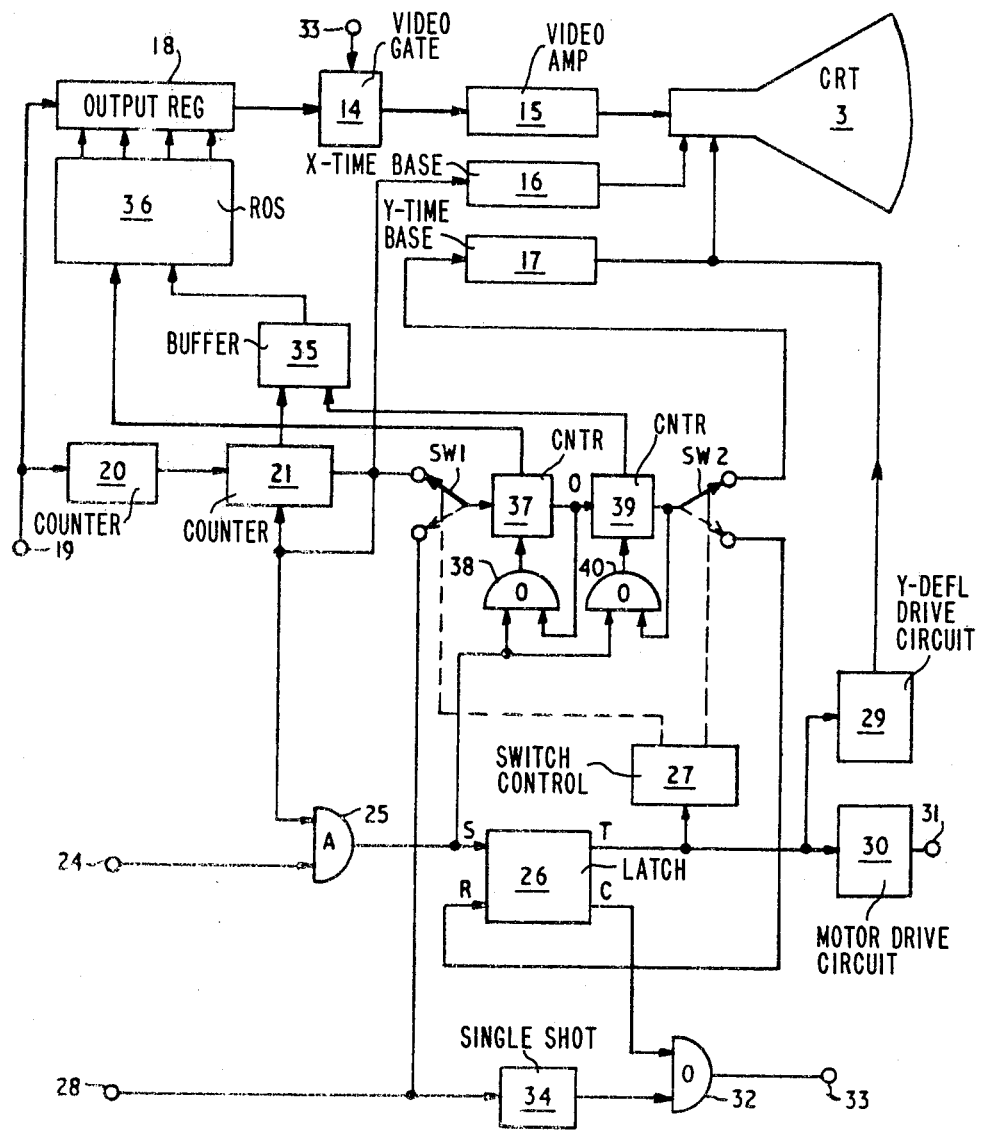
FIG. 4 shows a second implementation of the invention in which the CRT image is retained in a character buffer and read only store and image display is interrupted during printout.

FIG. 4 shows the circuit details of CRT control circuits for a noninterlaced raster-scanned CRT terminal employing a character generator and read-only store instead of the bit buffer used in the implementation described above. The modifications required by the print feature are included and since most of the circuitry is identical to that shown in FIG. 2, only differences between the two will be described in detail. Corresponding components in the two figures are identified by the same reference numerals for ease of identification.

In this implementation, the image to be displayed is stored character by character in coded form in a character buffer 35. The characters typically include alphanumerics and special characters and are ordered within the buffer in sequential image display rows as in the previous implementation. Each different character is additionally stored as a character block matrix of $m \times n$ bits in a character read-only store (ROS) 36. In this case, the column counter 21 is used to increment the character addresses along a selected character row in the character buffer. Since there are p character positions in each row, there are p corresponding column addresses. Character codes are supplied from the addressed character buffer 35 to the ROS 36 where they are each converted into the corresponding $m \times n$ matrix of bits. Since the image data is stored as two levels, two address counters are required instead of the single row counter 22 in the previous implementation described above. Thus, the output from column counter 21 is connected via switch SW1 in its display position as shown to the input of matrix row counter 37. This counter has n stages and is incremented each time an overflow occurs from counter 21. The contents are used to address the appropriate one out of m rows of the character block each line scan until the entire row of characters is displayed. Counter 37 itself then produces an overflow at its output which is used via OR-gate 38 to reset counter 37 and also to increment a character row counter 39. This counter has q stages equal in number to the number of rows of characters to be displayed. Each time counter 39 is clocked by an overflow pulse from counter 37, it increments the character row address of character buffer 34 so that the next row of characters are read out from the character buffer 35 under control of the counter 21. As before, the restart of the X-time base 16 is triggered by the overflow from counter 21 but now the flyback of the Y-time base is triggered via switch SW2 by the output of counter 39 which overflows when all q rows of characters forming the complete image have been displayed, that is at the end of a frame scan. The overflow pulse from counter 39 is used to reset the counter via OR-gate 40. Finally, since there are now two counters 37 and 39 instead of counter 22 in the previous implementation, both must be reset to zero at the start of each print cycle. This is achieved by applying the print initiate signal from AND-gate 25 as second inputs to the two OR-gates 38 and 40. In all other respects, the operation of this CRT printing apparatus is identical to that described in the previous implementation and will not be repeated.

Figure 5:
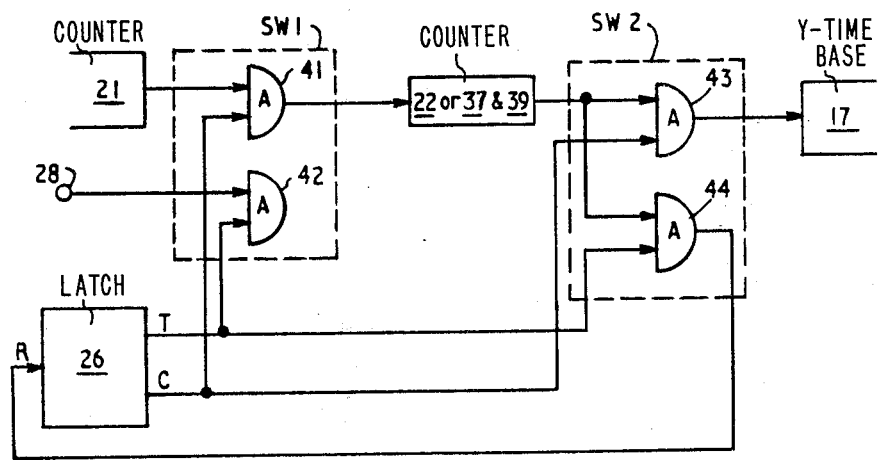
FIG. 5 shows switch logic included in the implementations shown in FIGS. 2 and 4.

FIG. 5 shows how the switches SW1 and SW2 and switch control circuit 27 shown schematically in FIGS. 2 and 4 are implemented and controlled in hardware. Switch SW1 consists essentially of two AND-gates 41 and 42 having a common output which is connected to the input of counter 22 (FIG. 2) or 37 (FIG. 4). One input to AND-gate 41 is supplied from the output of counter 21 and the other input from the C output of print latch 26. Since the signal on the C output is at an 'up' level when the print latch is in a reset condition, that is during the display cycle, the switch SW1 is in the position shown in FIGS. 2 and 4 and overflow pulses from counter 21 are transmitted through AND-gate 41 to increment counter 22 or 37. One input to AND-gate 42 is supplied from terminal 28 to which shaft encoder pulses are supplied during the print cycle. The other input is supplied from the T output of the print latch 26 and since this is at an 'up' level during the print cycle, the switch SW1 is in its print position shown dotted in FIGS. 2 and 4 and the counter 22 (FIG. 1) or 37 (FIG. 4) is incremented by the encoder pulses.

Similarly switch SW2 consists of two AND-gates 43 and 44 having a common input connected to the output of counter 22 (FIG. 2) or counter 39 (FIG. 4). The second input of AND-gate 43 is supplied from the C output of print latch 26 and its output connected to the Y-time base circuit 17. Thus, during the display cycle when the signal on the C output of latch 26 is at an 'up' level, the switch SW2 is in its display position so that the overflow of counter 32 (FIG. 2) or counter 39 (FIG. 4) is transmitted by AND-gate 43 to intitiate flyback of the Y-time base circuit. The second input of AND-gate 44 is supplied from the T output of print latch 26 and its output is connected to the reset terminal R of latch 26. The signal on the T output of latch 26 is 'up' during the print cycle, the switch SW2 in its print position position so that an overflow from counter 22 (FIG. 1) or counter 39 (FIG. 4) indicating the completion of the print cycle is used to reset the print latch. Both switches SW1 and SW2 are thus returned to their display positions.

MODE 2—Display And Print Concurrently

1. Bit Buffer Implementation

Figure 6:
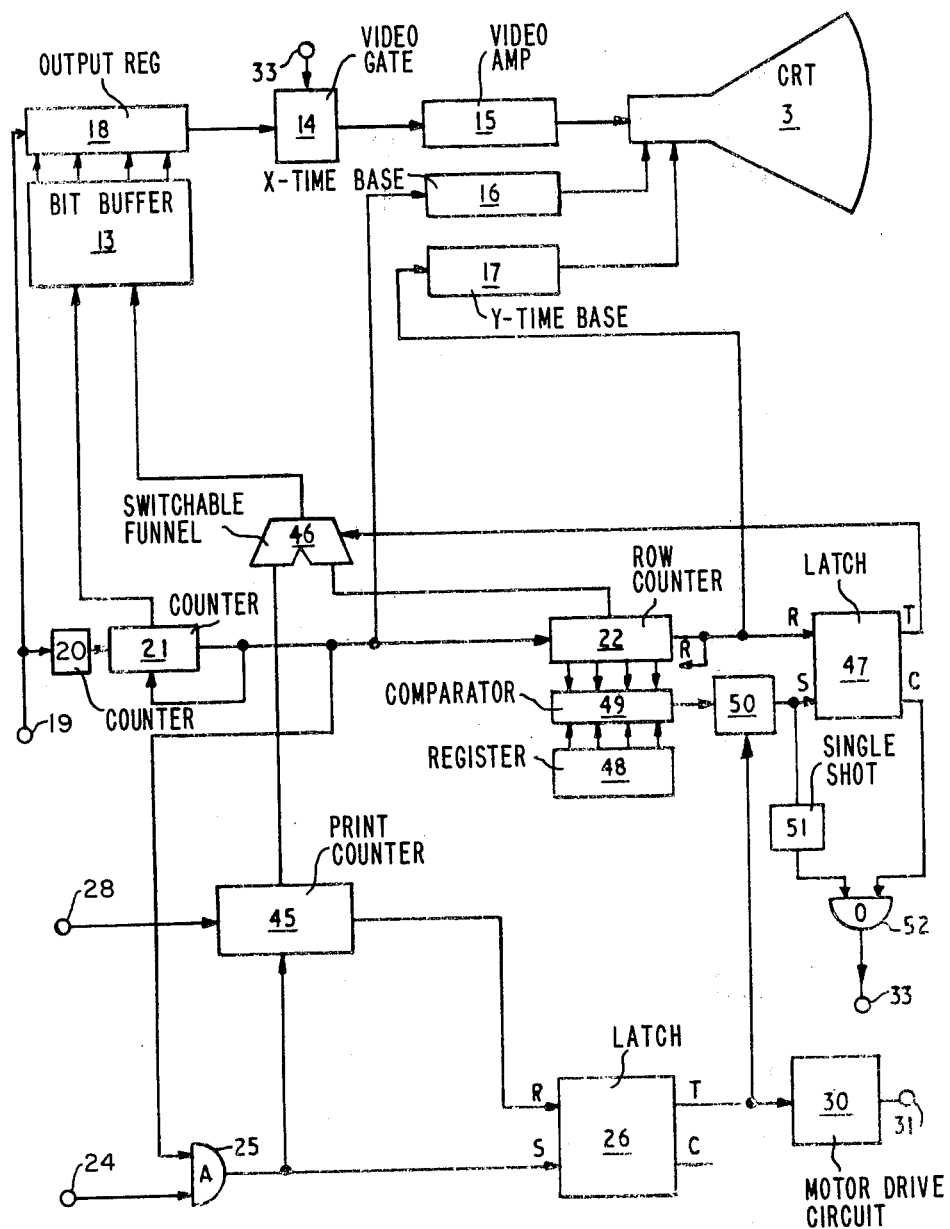
FIG. 6 shows a third implementation of the invention in which the CRT image is retained in a bit buffer and image display and printout are concurrent.

FIG. 6 shows the circuit modifications to the bit buffer implementation previously described with reference to FIG. 2 to enable normal viewing of the displayed information while printing is taking place. Basically, this is achieved by 'stealing' a predetermined number of horizontal scans from the end of each frame scan and using these as print line scans to perform the print operation. Since the print operation is now performed in a large number of separate short print cycles instead of a single print cycle, an additional print counter 45 is required to keep track of the current row address of the printed information.

The operation of the circuits shown in FIG. 6 for the normal display of information held in the bit buffer 13 is identical to the operation of the corresponding circuits in FIG. 2 and will not be repeated here. Many of the circuit components in FIG. 6 are identical to those in FIG. 2 and have been identified by the same reference numerals. It should be noted, however, that since display is continuous in this embodiment of the invention, the output from counter 21 is always connected to the input of counter 22. Further, since the addressing of the bit buffer needs to be switched at the end of a frame scan to the address of the current print row, the display row address signal derived from counter 22 is now applied to the bit buffer through one limb of a switchable funnel 46. A print row address signal derived from print counter 45 is applied to the bit buffer through the other limb of funnel 46. The funnel is switched from one limb to the other under control of the T output signal from a print timer latch 47.

The precise scan line at which the switch from display cycle to print cycle is made is determined by comparing the contents of scan line counter 22 with a predetermined line value stored in preset line register 48. The preset line value is chosen for a line scan which occurs toward the end of a frame and which is located behind the bezel at the bottom of the screen. At the end of a frame, the ramp signal from the Y time-base circuit 17 controlling the Y deflection of the scanning beam flattens out with the result that a number of horizontal scans at the end of the frame occur along the same or nearly the same horizontal row position. If, therefore, the scan lines selected for the print cycle occur during this period, there is no need to provide a special Y deflection bias voltage to the tube as was necessary in the Scheme A implementations described above. Further, the flared portions of the row of light fibers attached to the faceplate ensures collection of light from these scan lines even though there may be some misregistration between them.

Figure 7:
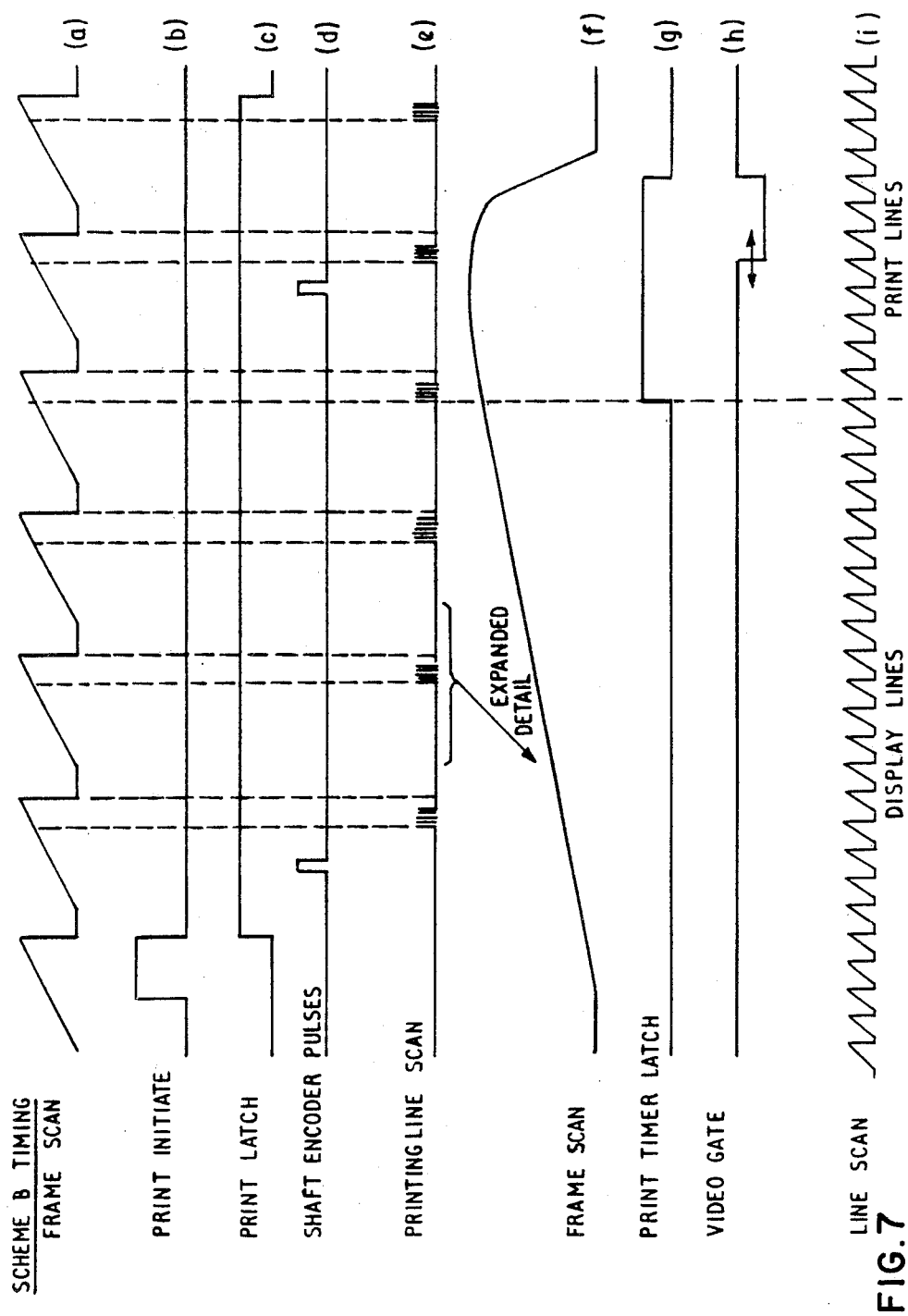
FIG. 7, including a–h, shows various waveforms generated during operation of the apparatus shown in FIG. 6.

Comparator 49 supplies an output pulse when the count in line counter 22 reaches the preset line value in register 48. This pulse is transmitted through gate 50, which is held open during the print cycle by the T output from print latch 26, and used to set print timer latch 47 and to trigger a variable single shot 51. During the print cycle, the video gate 14 is held open by the C output from latch 47, which is at its 'up' level transmitted through OR-gate 52 to the video gate terminal 33. This signal terminates when latch 47 is set at the start of a print cycle but is immediately replaced by the output from the single shot 51, which is applied as second input to OR-gate 52. The number of lines admitted by the video gate during each separate print cycle is determined by the time out period of the single shot 51. This period is selected to control the print density having regard to the sensitivity of the paper to the light emitted from the scan row, the motor speed and so on. The print cycle of this modified bit buffer arrangement will now be described with reference to the waveforms shown in FIG. 7.

A print initiate signal, waveform (b), applied to terminal 24 is gated through AND-gate 25 at the end of the current line scan, print latch 26 is set, waveform (c), and the contents of print line counter 45 reset to zero ready for the start of the print cycle. The positive T output from print latch 26 opens gate 50 and starts the print motor in motion. The print cycle is commenced at the end of a frame scan, waveform (a) and in expanded detail, waveform (f), after receipt of the first encoder pulse, waveform (d), on terminal 28. The flattening out of the frame scan is clearly seen in waveform (f). The compare signal from circuit 49 is transmitted through gate 50 and sets print timer latch 47 and triggers single shot 51. The T output from latch 47 switches the funnel 46 so that during the remaining scan rows of the frame, waveform (e), the first row of the image is read repetitively from the bit buffer in response to the address from print counter 45. The video gate 14 remains open transmitting a predetermined number of line scans, waveform (e), and in expanded detail in waveform (i), until the single shot times out and the video gate signal waveform (h) drops. The overflow from line counter 22 appearing at the end of each frame scan is used to reset counter 22 and print timer latch 47. The funnel 46 is switched at the start of the next frame scan so that the buffer is addressed from line counter 22 during the next display cycle. The process is repeated frame after frame with each shaft encoder pulses received on terminal 28 incrementing the bit buffer address represented by the count in print counter 45 so that the printed image produced corresponds to the displayed image. An overflow from print counter 45 signifies that the entire image has been printed and is used to reset print latch 26. Gate 50 is turned off and blocks any further pulses from compare circuit 49, which would set latch 47, itself reset at the end of the previous scan line. The T output from latch 47 therefore falls and the funnel 46 is switched to cause the bit buffer to be addressed from line counter 22 for the entire frame until a new print command is received on terminal 24.

MODE 2—Display And Print Concurrently

2. Character Generator Implementation

Figure 8:
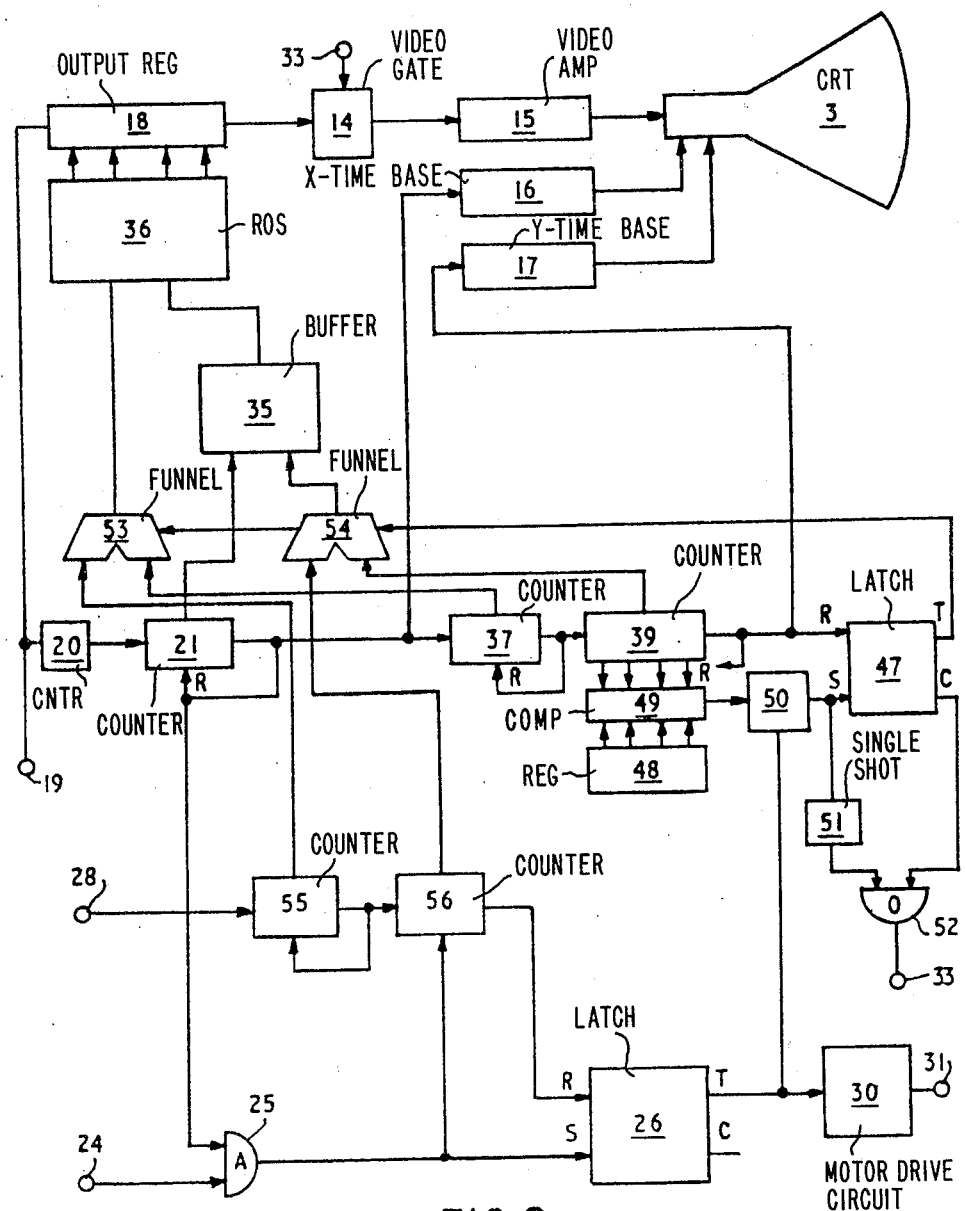
FIG. 8 shows a fourth implementation of the invention in which the CRT image is retained in a character buffer and read only store and image display and printout are concurrent.

FIG. 8 shows the circuit modifications to the character generator implementation previously described with reference to FIG. 4 to enable viewing of the displayed information while printing is taking place. The technique employed is the same as that used for the bit buffer implementation described with reference to FIG. 6. The majority of the component parts of the circuit are the same as in the circuits shown in FIG. 4 or FIG. 6 and have been given the same reference numerals for ease of identification. The need to address separately the two level store of character buffer 35 and ROS 36 requires that the single funnel 46 be replaced by two funnels 53 and 54 and the single print line counter 45 by replaced by two counters 55 and 56, corresponding to counters 37 and 39 respectively. Both funnels are switched simultaneously by the T output from print timer latch 47. Thus, during the display cycle the character address to character buffer 35 is supplied from counter 39 and the character matrix row address to ROS 36 from counter 37. During the print portion at the end of each frame scan, the character buffer address is supplied from the counter 56 and the ROS address from counter 55. Counter 55 is reset on occurrence of an overflow at its output, which occurs as each row of complete characters are printed. Counter 56 is reset by the gating of the print initiate pulse on terminal 24 through AND-gate 25. Apart from these minor differences, the operation of the apparatus shown in FIG. 8 will be clearly apparent having regard to the previous descriptions given above with reference to FIG. 4 and FIG. 7. Accordingly, further description of the operation of the apparatus shown in FIG. 8 will not be given.

Although the description of the four implementations of the invention given above all relate to non-interlaced systems, it will be apparent that the invention is equally applicable to systems with interlace. The bit buffer and character buffer/ROS addressing required with interlace is slightly more complex, but no difficulty is presented to one skilled in the art to adapt the above-described circuits in order to operate with such systems. Further, although in these embodiments of the invention the print image is formed using light sensitive paper developed by heat, other techniques for producing an image may be adopted. For example, the image need not be directly generated in the record medium, but may be generated as a charge pattern using an intermediate photoconductive layer and then developing the charge pattern into a visible image on ordinary paper by xerographic techniques. Such a technique is described, for example, in U.K. Pat. No. 1,068,402.

What is claimed is:

1. Apparatus for producing hard copy of an optical image displayed on a faceplate of a raster-scanned CRT display device comprising in combination:
   a raster-scanned CRT display device having a faceplate;
   a plurality of light fibers supported in a row along a preselected scan line position on said faceplate arranged to collect light emitted from contiguous regions along said scan line position and to transmit any such light to corresponding positions along a print row remote from said CRT faceplate;
   means for supporting a print receiving medium at said print row, the arrangement being such that, in use, an image of the light transmitted by said fibers is produced in said medium;
   means for moving said medium supported at said print row in a direction transverse to said print row;
   display logic operable to produce successive cycles of operation, each cycle including a display mode and a print mode, said display logic operable to display a raster screened image on the faceplate of said CRT during said display mode and operable in said print mode, in response to the rate of movement of said medium, to control the supply of successive raster-scanned lines of said image to said preselected scan line position, so that images resulting therefrom representing successive raster scan lines of the image are produced in corresponding print line positions in said medium; and
   means operable to develop images so produced.

2. Apparatus as claimed in claim 1, in which said display logic is operable in response to a print initiate signal to suspend the continuous vertical deflection of the CRT raster and to provide a predetermined constant vertical deflection, whereby subsequent horizontal scans of said CRT raster all occur at said preselected scan line position.

3. Apparatus as claimed in claim 1, in which said display logic is operable in response to a print initiate signal to display the entire optical image during a first plurality of scan lines in each complete frame scan, and to repetitively display a selected scan row of said image during a second plurality of scan lines in each complete frame scan, so that said second plurality of scan lines all occur at, or substantially at, said preselected scan line position on the faceplate of the CRT.

4. Apparatus as claimed in claim 3, in which said display logic includes means to progressively change the scan row of said image supplied for display during said second plurality of scan lines at a rate determined by said rate of movement of the print receiving medium past said print row, whereby the image formed in said medium corresponds to the image displayed by means of the first plurality of light fibers.

5. Apparatus as claimed in claim 4, further including means for producing a series of pulses, the repetition rate of which indicates the rate of movement of said print receiving medium, said series of pulses being supplied as input to said display logic, and used to control the supply of successive raster-scanned lines of an image to said preselected scan line position.

6. Apparatus as claimed in claim 5, in which said means for producing a series of pulses is a shaft encoder mounted to sense rotational position of said roller.

7. Apparatus as claimed in claim 1, in which said means for supporting a print receiving medium is a roller mounted with its axis of rotation parallel to the ends of the row of light fibers defining the print row and positioned with its surface closely adjacent to the ends of said light fibers whereby, in use, images of light transmitted by said fibers are formed in a print receiving medium supported thereon.

8. Apparatus as claimed in claim 1, in which said raster-scanned CRT device is supported in an enclosure having an aperture defining an operator viewing area on the faceplate, said preselected scan line position being located on a portion of the faceplate outside said viewing area.

9. Apparatus as claimed in claim 8, in which a motor in said enclosure is operable on receipt of a print initiate signal to draw print receiving medium from a supply roll of said material past said print row position, through the developing station, and to deliver the medium through a longitudinal slot in the enclosure for operator use.

10. Apparatus as claimed in claim 9, in which the print receiving medium for use therein has a light sensitive coating in which latent images are formed on exposure to light patterns transmitted by said light fibers, said latent images being subsequently developed by heat said developing station to produce visible images in said medium.

11. Apparatus as claimed in claim 1, in which said image to be displayed is stored in binary form in a bit buffer forming part of said raster-scanned CRT display device.

12. Apparatus as claimed in claim 1, in which characters forming an image to be displayed are stored in sequence in coded form in a character buffer and each different character is separately stored in read-only store as a two-dimensional character block of binary bits.

13. A method for producing hard copy of an optical image displayed on a faceplate of a raster-scanned CRT tube display device comprising the steps of:
   selecting a predetermined horizontal line scan position on the faceplate;
   controlling the tube display logic to produce successive cycles of operation, each cycle including a display mode and a print mode, said display logic operable to display a raster screened image on the faceplate of said CRT during said display mode and operable in said print mode, to supply in succession individual raster scan lines of the image at said predetermined line scan position;
   guiding, by means of optical fibers the successive optical patterns formed at said predetermined scan line to a corresponding print line remote from the tube faceplate;
   moving a print receiving medium past said print line in a direction transverse thereto;
   generating images in said moving medium of said successive optical patterns in corresponding line position on said medium, and
   thereafter developing images so produced.

* * * * *